US 9,680,380 B2

(12) United States Patent
Akiyama

(10) Patent No.: US 9,680,380 B2
(45) Date of Patent: Jun. 13, 2017

(54) SEMICONDUCTOR DEVICE AND POWER CONVERSION DEVICE

(71) Applicant: HITACHI, LTD., Chiyoda-ku, Tokyo (JP)

(72) Inventor: Satoru Akiyama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/908,867

(22) PCT Filed: Aug. 1, 2013

(86) PCT No.: PCT/JP2013/070943
§ 371 (c)(1),
(2) Date: Jan. 29, 2016

(87) PCT Pub. No.: WO2015/015623
PCT Pub. Date: Feb. 5, 2015

(65) Prior Publication Data
US 2016/0164413 A1    Jun. 9, 2016

(51) Int. Cl.
*G05F 1/00* (2006.01)
*H02M 3/158* (2006.01)
(Continued)

(52) U.S. Cl.
CPC ...... *H02M 3/158* (2013.01); *H03K 17/04206* (2013.01); *H03K 17/165* (2013.01);
(Continued)

(58) Field of Classification Search
CPC ......... H02M 7/537; H02M 2001/0009; H02M 3/158; H03K 2217/0081; H03K 17/04206; H03K 2217/0036; H03K 17/165
(Continued)

(56) References Cited

U.S. PATENT DOCUMENTS 5,351,182 A * 9/1994 Miyazaki ............... H02M 7/538
363/132
2003/0197696 A1* 10/2003 Onozawa ............... G09G 3/296
345/212
(Continued)

FOREIGN PATENT DOCUMENTS

JP    2002-152023 A    5/2002
JP    2006-047953 A    2/2006
(Continued)

*Primary Examiner* — Jeffrey Gblende
*Assistant Examiner* — Afework Demisse
(74) *Attorney, Agent, or Firm* — Miles & Stockbridge P.C.

(57) ABSTRACT

Provided is a semiconductor device which drives a power semiconductor device, in which dead times generated when switch elements of upper and lower arms are turned on and off are minimized, and a loss of a power conversion device is reduced. A semiconductor device used in a power conversion device that includes a first switch element of which the drain is connected to a first power source voltage and a second switch element of which the source is connected to a second power source voltage includes a first drive circuit that drives the first switch element, a second drive circuit that drives the second switch element, a first level shift circuit, and a second level shift circuit. The first drive circuit is connected to a third power source voltage higher by a predetermined potential with respect to a source potential of the first switch element and the source potential of the first switch element. The second drive circuit is connected to a fourth power source voltage higher by a predetermined potential with respect to the second power source voltage and the second power source voltage. Power source potentials input to the first level shift circuit and the second level shift circuit are the third power source voltage and the second power source voltage.

15 Claims, 13 Drawing Sheets

(51) Int. Cl.
*H03K 17/042* (2006.01)
*H03K 17/16* (2006.01)
*H02M 7/537* (2006.01)
*H02M 1/00* (2006.01)
*H03K 5/131* (2014.01)

(52) U.S. Cl.
CPC .... *H02M 7/537* (2013.01); *H02M 2001/0009* (2013.01); *H03K 5/131* (2013.01); *H03K 2217/0036* (2013.01); *H03K 2217/0081* (2013.01)

(58) Field of Classification Search
USPC ............................................. 323/271
See application file for complete search history.

(56) References Cited

U.S. PATENT DOCUMENTS

| | | | |
|---|---|---|---|
| 2005/0285819 | A1 | 12/2005 | Onozawa et al. |
| 2006/0279346 | A1 | 12/2006 | Seki et al. |
| 2008/0246519 | A1* | 10/2008 | Suzuki ................ H03K 5/1515 327/141 |
| 2012/0154007 | A1 | 6/2012 | Imanishi et al. |

FOREIGN PATENT DOCUMENTS

| | | |
|---|---|---|
| JP | 2006-352195 A | 12/2006 |
| JP | 2009-044814 A | 2/2009 |
| JP | 2012-130209 A | 7/2012 |

* cited by examiner

81

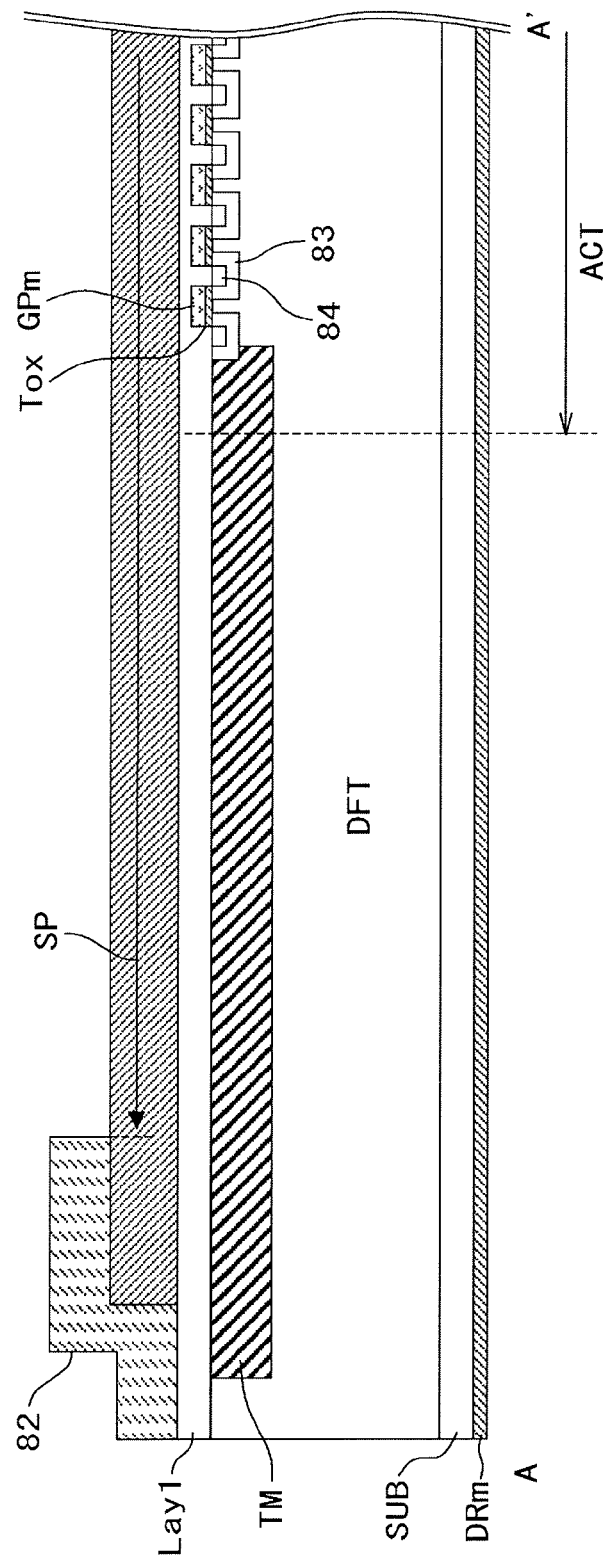

SEMICONDUCTOR DEVICE AND POWER CONVERSION DEVICE

TECHNICAL FIELD

The present disclosure relates to a semiconductor device and can be applied to, for example, a power conversion device which includes a power device and a semiconductor device for driving the power device.

BACKGROUND ART

In the main trend of society such as global environmental preservation, the importance of electronic businesses for reducing an environmental load comes to the fore. Particularly, a power device is used in an inverter device of a railroad vehicle or a hybrid/electric vehicle, an inverter device of an air conditioner, and a power source of consumer equipment such as a personal computer. The improvement in performance of the power device contributes to the improvement in efficiency of the power conversion of an infrastructure system and the consumer equipment. The improvement in the power conversion efficiency means a reduction of energy resources necessary for the operation of the system. In other words, the amount of carbon dioxide emission can be reduced; that is, an environmental load can be reduced. Therefore, research and development for improving the performance of the power device are actively performed by companies.

In general, the power device is made of a silicon material (Si) similar to a large-scale integrated circuit (LSI). In a power conversion device (the inverter device and the like) using such a Si power device, the development for realizing a low ON resistance (Ron), a high current density, and a high breakdown voltage is actively performed such that an element structure of diodes and switch elements and a profile of impurity concentration are optimized in order to reduce the energy loss caused in the inverter device.

In recent years, compound semiconductors such as silicon carbide (SiC) and gallium nitride (GaN) having a bandgap larger than silicon are drawing an attention as materials of the power device. Since the compound semiconductor has a large bandgap, a breakdown voltage thereof is 10 times larger than that of silicon. Therefore, a compound device can be made thinner than a Si device, and a resistance (Ron) during conduction is significantly lowered. As a result, a so-called conduction loss ($Ron \cdot i^2$) obtained by multiplying the resistance (Ron) by the conduction current (i) can be reduced, and thus it can attribute to improvement in power efficiency. Paying attention to such an advantage, the diode and the switch element using the compound material are actively developed in domestic and foreign countries.

As an application of the power device, for example, a converter device of a synchronous rectifying type and an inverter device of a DC/AC conversion device are generally exemplified. Describing the inverter device in simple, two sets of the switch elements of the power device with a freewheel diode are connected in series between a power source on the high voltage side (upper arm) and a power source on the low voltage side (lower arm). A DC level at the previous stage of the inverter device is converted into an AC level by alternately turning on and off the switch elements of the upper and lower arms so as to be supplied to a load circuit such as an AC insulating transformer or a motor at the following stage. Further, a dead time generation circuit is included in a gate drive circuit to control the switches of the upper and lower arm to be alternately turned on and off (that is, the switch elements of the upper and lower arms do not enter the ON state at the same time). Similarly in the converter device of the synchronous rectifying type, the switch elements of the upper and lower arms are not simultaneously turned on since the dead time is set to be sufficiently long in general. However, when the dead time is unnecessarily lengthened, a conductive loss component of the diode is increased, and the power conversion efficiency of the inverter device or the converter device may be worse. On the other hand, when the dead time is excessively shortened, the switch elements of the upper and lower arms may enter the ON state at the same time, and thus a significantly large through current flows from the high potential power source to the low potential power source. Therefore, the switch elements of the upper and lower arms may be broken. For this reason, an optimal minimization of the dead time of the inverter device and the converter device is an important point for reducing the loss in the power conversion device. Further, in a case where the ON resistance of a main switch element is small to be several m$\Omega$, and a reverse conduction voltage of the main switch element is lower than the ON voltage of the diode at the time of freewheeling (an application of the power source voltage of about tens of V), the effect of loss reduction by the minimization of the dead time is increased.

For example, Patent Document 1 discloses a configuration in which level shift circuits are included in both of a high-side driver and a low-side driver in order to optimize the dead time in a DC/DC converter of the synchronous rectifying type.

CITATION LIST

Patent Document

Patent Document 1: JP 2009-44814 A

SUMMARY OF THE INVENTION

Problems to be Solved by the Invention

After studying an inverter device of a high voltage type equal to or more than hundreds of voltages and a converter device of a synchronous rectifying type, the inventor has found out that there are the following new problems in the minimization of the dead time.

In other words, the problems are (1) converting a control signal operated at an amplitude of a low potential (for example, 15 V or so) on the input side of a gate drive circuit to be a high potential (for example, 300 V or so), and (2) equalizing a process, a voltage, and a temperature variation dependency at the both delay times as it can be in a circuit delay time when the converted gate drive signal on the high side is generated and a circuit delay time when a gate drive signal on the low side is generated.

In the technology disclosed in Patent Document 1, since the input potential of the level shift circuit of the high side is the low potential (for example, 15 V or so), in a case where the operation potential of the level shift circuit of the high side is shifted to the high potential, the level shift circuit cannot be operated. In addition, there is no specific description on the level shift circuit which converts the control signal into the high potential (for example, 300 V or so). In other words, in a high voltage power conversion circuit, it has been found out that the dead time when the switch elements of the upper and lower arms are alternately turned on and off is difficult to be minimized.

An object of the present disclosure is to minimize the dead time when the switch elements of the upper and lower arms are turned on and off in a semiconductor device for driving the power device so as to reduce a loss in a power conversion device.

Other objects and novel characteristics besides the above description of this disclosure will be apparent through the explanation and the accompanying drawings of this specification.

Solutions to Problems

In the present disclosure, the outline of a representative configuration is simply described as follows.

A semiconductor device is used in a power conversion device which includes a first switch element of which the drain is connected to a first power source voltage and a second switch element of which the source is connected to a second power source voltage. A source of the first switch element and a drain of the second switch element are electrically connected. The semiconductor device includes a first drive circuit which drives the first switch element, a second drive circuit which drives the second switch element, a first level shift circuit, and a second level shift circuit. The first drive circuit is connected to a third power source voltage higher by a predetermined potential with respect to a source potential of the first switch element and the source potential. The second drive circuit is connected to a fourth power source voltage higher by a predetermined potential with respect to the second power source voltage and the second power source voltage. Power source potentials input to the first level shift circuit and the second level shift circuit are the third power source voltage and the second power source voltage.

Effects of the Invention

With the semiconductor device applied to a power conversion device, it is possible to improve a conversion efficiency at the time of power conversion.

BRIEF DESCRIPTION OF THE DRAWINGS

FIG. 8B is a cross-sectional view illustrating a schematic configuration of the SiC-MOSFET according to the fourth example.

MODE FOR CARRYING OUT THE INVENTION

Figure 11:
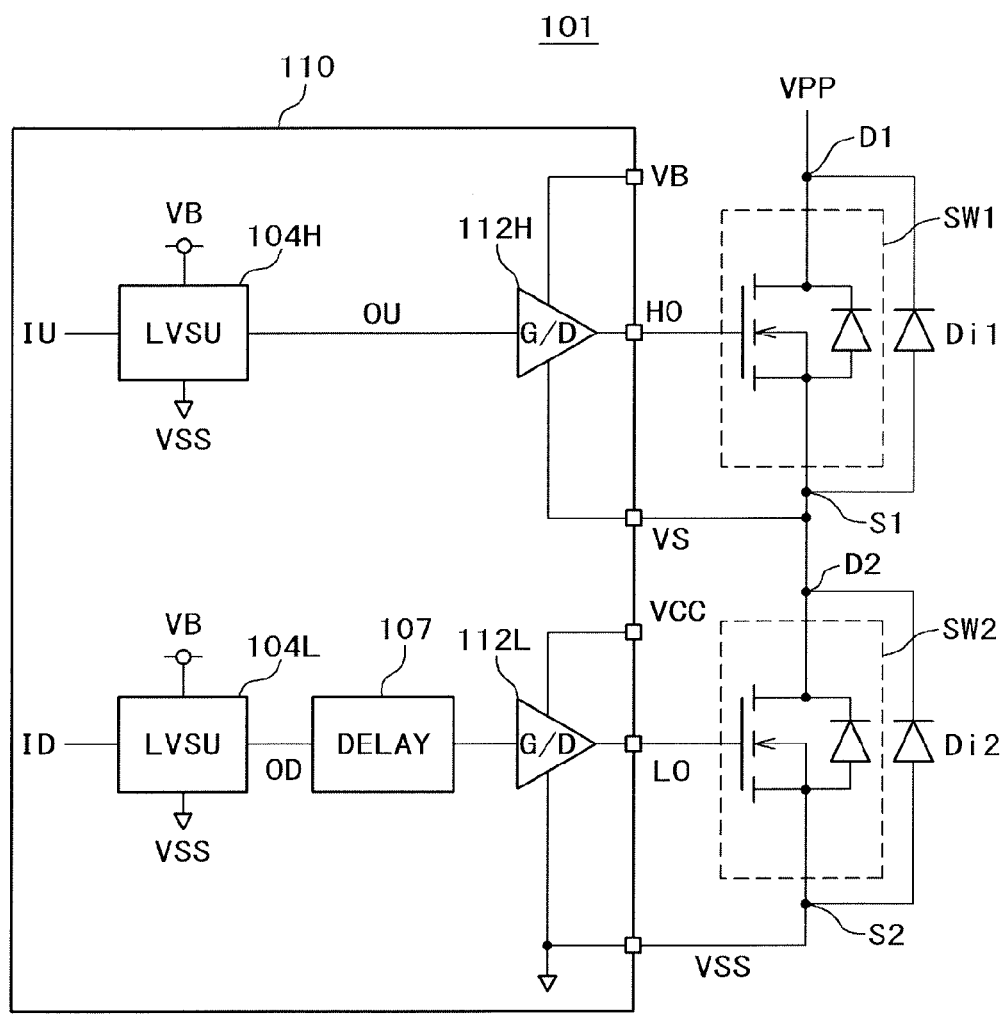
FIG. 11 is a diagram for describing a semiconductor device according to an embodiment.

FIG. 11 is a diagram for describing a semiconductor device according to an embodiment.

A semiconductor device 110 according to the embodiment is used in a power conversion device 101. The power conversion device 101 includes a first switch element SW1 of which a drain D1 is connected to a first power source voltage (VPP) and a second switch element SW2 of which a source S2 is connected to a second power source voltage (VSS). A source S1 of the first switch element SW1 and a drain D2 of the second switch element SW2 are electrically connected. The semiconductor device 110 includes a first drive circuit 112H which drives the first switch element SW1, a second drive circuit 112L which drives the second switch element SW2, a first level shift circuit 104H, and a second level shift circuit 104L. The first level shift circuit 104H converts a voltage level of an input signal (IU) for the first drive circuit 112H and outputs a signal (OU). The second level shift circuit 104L converts a voltage level of an input signal (ID) for the second drive circuit 112L and outputs a signal (OD). The first drive circuit 112H connects a third power source voltage (VB) higher by a predetermined potential with respect to a source potential (VS) of the first switch element SW1 and the source potential (VS). The second drive circuit SW2 connects a fourth power source voltage (VCC) higher by a predetermined potential with respect to the second power source voltage (VSS) and the second power source voltage (VSS). The power source potentials input to the first level shift circuit 104H and the second level shift circuit 104L are the third power source voltage (VB) and the second power source voltage (VSS).

The semiconductor device 101 desirably includes a delay circuit 107 to finely adjust a dead time. The delay circuit 107 is desirably disposed between the second level shift circuit 104L and the second drive circuit 112L. In addition, the delay circuit 107 desirably includes a circuit to generate a plurality of delay times, and is configured to select the plurality of delay times using an external input signal.

Further, the power conversion device 101 includes a first freewheel diode Di1 connected to the first switch element SW1 in parallel and a second freewheel diode Di2 connected to the second switch element SW2 in parallel.

The dead time can be optimized by using the semiconductor device 110 according to the embodiment in the power conversion device 101, and a conversion efficiency at the time of the power conversion can be improved.

In the following embodiment, the description will be made to be divided into a plurality of sections or examples as needed for the sake of convenience, these examples are not unrelated, and one example is related to modifications, details, or supplement description of some or all of the other example unless otherwise mentioned. In addition, in a case where the number of elements (including numbers, values, amounts, and ranges) are mentioned in the following examples, these numbers are not limited to specified numbers but may be equal to or more than the specified numbers or not except a case where the number is specified and a case where the number is apparently limited to a specified number in principle.

Furthermore, it is a matter of course that the components (including element steps) may be not essential in the following examples unless otherwise mentioned and except a case where these components are considered as essential in principle. Similarly, in the following examples, shapes and positional relations of the components may include other ones substantially approximate or similar thereto unless otherwise mentioned and except a case where it is considered to be different as apparent in principle. These assumptions are the same in the numbers and the ranges.

Further, the description in the examples will be made using a MOSFET (Metal Oxide Semiconductor Field Effect Transistor, abbreviated as a MOS transistor) as an example of a MISFET (Metal Insulator Semiconductor Field Effect Transistor), but it does not means that a non-oxide film is excluded as a gate insulating film. In the drawings, a circle symbol is attached to the gate of a p-channel MOS transistor (PMOS transistor) for distinction from an n-channel MOS transistor (NMOS transistor).

Hereinafter, the examples will be described in detail with reference to the drawings. Further, the same members are attached by the same symbols in principle in all the drawings for describing the examples, and the redundant description will be omitted.

First Example

Hereinafter, a semiconductor device of a first example will be described using FIGS. 1 to 4.

Figure 1:
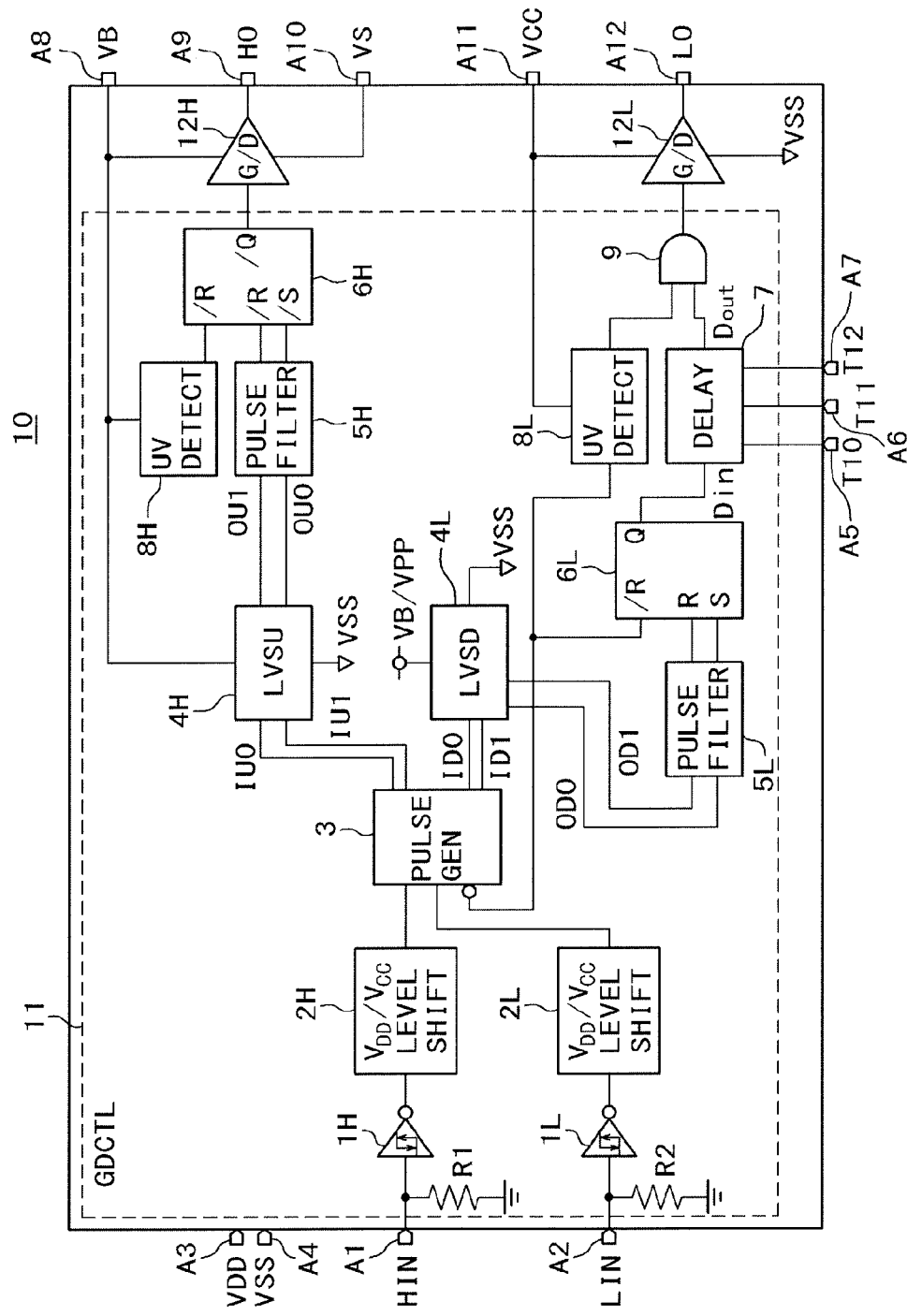
FIG. 1 is a block diagram of a semiconductor device according to a first example.

FIG. 1 is a block diagram of the semiconductor device according to the first example. A semiconductor device 10 includes a gate drive control circuit (GDCTL) 11, an upper-arm gate drive circuit (G/D) 12H, and a lower-arm gate drive circuit (G/D) 12L. The semiconductor device 10 is a semiconductor device which drives a switch element equipped with a power device made of Si, SiC, GaN, or the like. The semiconductor device 10 is formed on one Si substrate or a plurality of Si substrates. Further, while not illustrated in the drawing, the semiconductor device 10 further includes a circuit which receives a current from a sensing element (described below) to monitor the current of the switch element.

The configuration and the operation of the semiconductor device 10 will be described below.

(a) Signal Input

When a high-side input signal (HIN) input to a terminal A1 is asserted, a voltage level conversion is performed by a high-side level shift circuit ($V_{DD}/V_{CC}$ LEVEL SHIFT) 2H through a high-side Schmitt trigger circuit 1H. The high-side Schmitt trigger circuit 1H and a resistor R1 serve as a circuit which transfers a stable output level to the high-side level shift circuit 2H even in a case where the high-side input signal HIN is fluctuated. Further, the high-side level shift circuit 2H converts the output level of the high-side input signal HIN into a low-voltage-side power source level (VCC) (for example, 15 V) applied to a terminal A11. The high-side Schmitt trigger circuit 1H is operated by the power source voltage (VDD) applied to a terminal A3 and a low-voltage-side source level (VSS) applied to a terminal A4. When a low-side input signal (LIN) applied to a terminal A2 is asserted, the voltage level conversion is performed by a low-side level shift circuit ($V_{DD}/V_{CC}$ LEVEL SHIFT) 2L through a low-side Schmitt trigger circuit 1L. The low-side Schmitt trigger circuit 1L and a resistor R2 serve as a circuit which transfers a stable output level to the low-side level shift circuit 2L even in a case where the low-side input signal LIN is fluctuated. Further, a low-side level conversion circuit 2L converts the output level of the low-side input signal LIN into the low-voltage-side power source level (VCC). The low-side Schmitt trigger circuit 1L is operated by the power source voltage (VDD) applied to the terminal A3 and the low-voltage-side source level (VSS) applied to a terminal A4.

(b) One-Shot Pulse Generation Circuit

A one-shot pulse generation circuit (PULSE GEN) 3 generates respective one-shot pulse signals (IU0, IU1) at rising and falling edges of the output of the high-side level shift circuit 2H. In addition, the one-shot pulse generation circuit 3 generates respective one-shot pulse signals (ID0, ID1) at rising and falling edges of the output of the low-side level shift circuit 2L. The one-shot pulse generation circuit 3 is operated by the low-voltage-side power source level (VCC) applied to the terminal A11 and the low-voltage-side source level (VSS) applied to the terminal A4.

(c) Generation of Control Signal on High Side

A high-side high-voltage level shift circuit (LVSU) 4H converts the output levels of the one-shot pulse signals (for the rising edge (IU0) and for he falling edge (IU1)) into a high-voltage-side power source level (VB) applied to a terminal A8 and the low-voltage-side source level (VSS) applied to the terminal A10. The high-voltage-side power source level (VB) is set to for example, a voltage (VS+15 V) added with 15 V with reference to a high-voltage-side source level (VS) of the upper-arm gate drive circuit 12H, and the set voltage becomes a high-voltage-side power source voltage of the gate drive circuit (G/D) 12H. The details of the high-side high-voltage level shift circuit 4H will be described below.

Output signals (OU0, OU1) of the high-side high-voltage level shift circuit 4H are input to a high-side RS latch circuit 6H through a high-side pulse filter (PULSE FILTER) 5H. The one-shot pulse signal (for the rising edge) (OU0) from the high-side high-voltage level shift circuit 4H becomes a set input of the high-side RS latch circuit 6H, and the one-shot pulse signal (for the falling edge) (OU1) from the high-side high-voltage level shift circuit 4H becomes a reset input of the high-side RS latch circuit 6H. At this time, the pulse filter 5H removes unstable signals other than a predetermined control signal.

An output signal of the high-side RS latch circuit 6H is transferred to the upper-arm gate drive circuit 12H. The gate drive circuit 12H receives the output signal of the high-side RS latch circuit 6H, and outputs an upper-arm switch control signal (HO) to a terminal A9. Herein, /R (reset input), /S (set input), and /Q (output) indicate "Active Low". In other words, the terminals are activated by an active low signal.

A high-side voltage detect protection circuit (UV DETECT) 8H monitors the high-voltage-side power source level (VB), and assets the reset input to the high-side RS latch circuit 6H when the high-voltage-side power source level (VB) is lowered, so that the switch element is protected through the upper-arm gate drive circuit 12H. The upper-arm gate drive circuit 12H outputs the upper-arm switch control signal (HO) of the high level when the input signal is at the low level, and outputs the upper-arm switch control signal (HO) of the low level when the input signal is at the high level.

The high-side pulse filter 5H, the high-side RS latch circuit 6H, the high-side voltage detect protection circuit 8H, and the upper-arm gate drive circuit 12H are operated by the high-voltage-side power source level (VB) applied to the terminal A8 and the high-voltage-side source level (VS) applied to a terminal A10.

(d) Generation of Control Signal on Low Side

A low-side high-voltage level shift circuit (LVSD) 4L converts the output levels of the one-shot pulse signals (for the rising edge (ID0) and for the falling edge (ID1)) into the high-voltage-side power source level (VB) and the low-voltage-side source level (VSS). The details of the low-side high-voltage level shift circuit 4L will be described below.

Output signals (OD0, OD1) of the low-side high-voltage level shift circuit 4L are input to a low-side RS latch circuit 6L through a low-side pulse filter (PULSE FILTER) 5L. The one-shot pulse signal (for the rising edge) (OD0) from the low-side high-voltage level shift circuit 4L becomes the set input of the low-side RS latch circuit 6L, and the one-shot pulse signal (for the falling edge) (OD1) from the low-side high-voltage level shift circuit 4L becomes the reset input of the low-side RS latch circuit 6L. At this time, the low-side pulse filter 5L removes the unstable signals other than a predetermined control signal.

A delay circuit (DELAY) 7 receives the output signal (Din) of the low-side RS latch circuit 6L, and transfers the output signal to the lower-arm gate drive circuit 12L. The gate drive circuit 12L receives the output signal (Dout) of the delay circuit 7, and outputs a lower-arm switch control signal (LO) to a terminal A12. Herein, /R (reset input) indicates "Active Low", and S (set input) and Q (output) indicate "Active High".

A low-side voltage detect protection circuit (UV DETECT) 8L monitors the low-voltage-side power source level (VCC), and asserts the reset input to the low-side RS latch circuit 6L when the low-voltage-side power source level (VCC) is lowered, and sets the output of a logical product circuit 9 to the low level, so that the switch element is protected through the lower-arm gate drive circuit 12L. The lower-arm gate drive circuit 12L outputs the lower-arm switch control signal (LO) of the high level when the input signal is at the high level, and outputs the lower-arm switch control signal (LO) of the low level when the input signal is at the low level.

The delay circuit 7 delays the output signal of the low-side RS latch circuit 6L to transfer the output signal to the logical product circuit 9 at the following stage, so that a so-called dead time is adjusted in order not to simultaneously turn on the switch elements of the upper and lower arms. Further, the circuit configuration of the delay circuit 7 is not particularly limited and, for example, may be configured by CMOS inverting circuits of multiple stages. The details of the delay circuit 7 will be described below.

The low-side pulse filter 5L, the low-side RS latch circuit 6L, the delay circuit 7, the low-side voltage detect protection circuit 8L, and the lower-arm gate drive circuit 12L are operated by the low-voltage-side power source level (VCC) applied to the terminal A11 and the high-voltage-side source level (VSS) applied to the terminal A4.

(e) High-Voltage Level Shift Circuit

Figure 2:
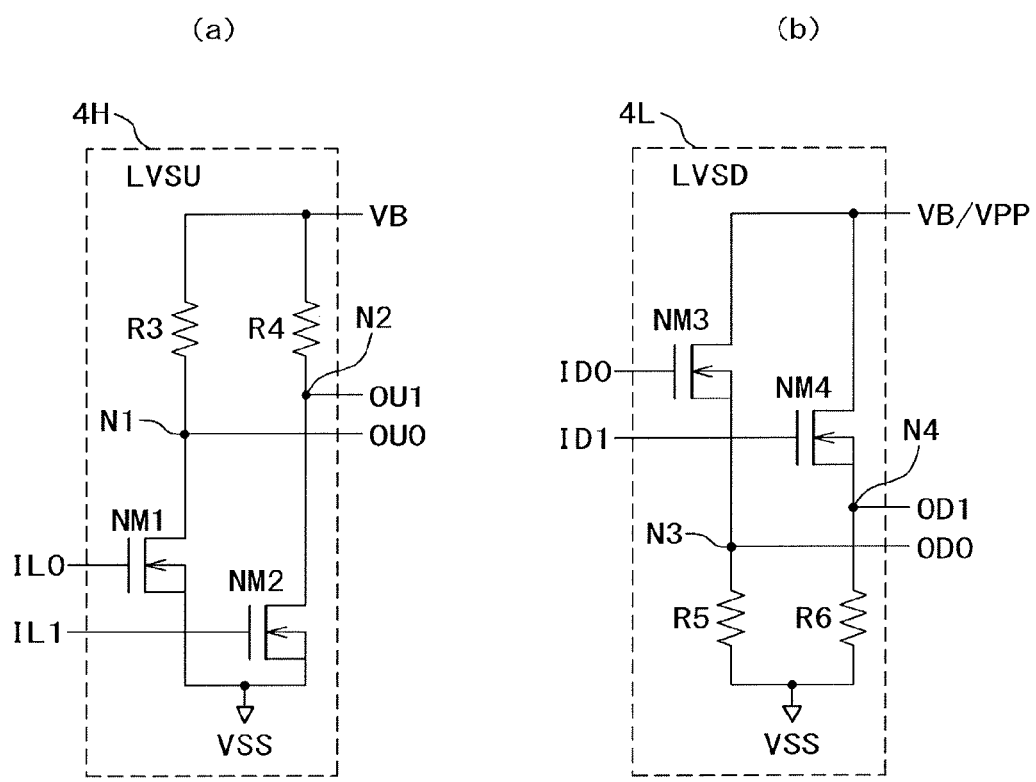
FIG. 2 is a diagram illustrating a level shift circuit according to the first example.

FIG. 2 illustrates an exemplary configuration of the high-side high-voltage level shift circuit (LVSU) and the low-side high-voltage level shift circuit (LVSD). The high-side high-voltage level shift circuit 4H and the low-side high-voltage level shift circuit 4L are configured by a plurality of high-breakdown NMOS transistors NM and a plurality of resistors R.

The sources of high-breakdown NMOS transistors NM1 and NM2 of the high-side high-voltage level shift circuit 4H are connected to the low-voltage-side source level (VSS). In addition, resistors R3 and R4 are connected to the high-voltage-side power source level (VB) and output nodes N1 and N2. A rising edge signal of the gate drive circuit 12H of the upper arm is generated when the output signal IU0 from the one-shot pulse generation circuit 3 is input to the high-side high-voltage level shift circuit 4H. The output nodes N1 and N2 may be operated at a high potential (for example, about 300 V), but a gate drive signal is normally generated without causing a breakdown of the element by employing the high-breakdown NMOS transistors NM1 and NM2. Similarly, the falling edge signal of the gate drive circuit 12H of the upper arm is generated when the control signal IU1 from the one-shot pulse generation circuit 3 is input to the high-voltage level shift circuit 4H.

In addition, the drains of high-breakdown NMOS transistors NM3 and NM4 of the low-side high-voltage level shift circuit 4L are connected to the high-voltage-side power source level (VB), and resistors R5 and R6 are connected to the low-voltage-side source level (VSS). In addition, the sources of the high-breakdown NMOS transistors NM3 and NM4 are connected to output nodes N3 and N4. Similarly to the high-side high-voltage level shift circuit 4H, the rising edge signal of the gate drive circuit 12L of the lower arm is generated when the output signal ID0 from the one-shot pulse generation circuit 3 is input to the low-side high-voltage level shift circuit 4L. Since the high-breakdown NMOS transistor NM3 is operated in a source follower mode, the output node N3 is increased to almost the same level as the low-voltage-side power source level (VCC) of the gate drive circuit 12L of the lower arm, and the high level signal is input to the circuit at the following stage so as to serve as the rising edge signal of the gate drive circuit 12L of the lower arm. Similarly, the falling edge signal of the gate drive circuit 12L of the lower arm is generated when the control signal ID1 from the one-shot pulse generation circuit 3 is input to the high-voltage level shift circuit 4L.

Further, the power source potentials input to the high-side high-voltage level shift circuit 4H and the low-side high-voltage level shift circuit 4L are the high-voltage-side power source level (VB) and the low-voltage-side source level (VSS).

With the configuration described above, the high-side high-voltage level shift circuit 4H and the low-side high-voltage level shift circuit 4L can be operated at the same power source level so that a process, a voltage, and a temperature dependency at a delay time of the level shift circuit can be equalized on both high and low sides. In other words, since a designed dead time tde0 can be reliably secured, the dead time can be minimized, and the conversion efficiency of the power conversion device can be improved.

Figure 5:
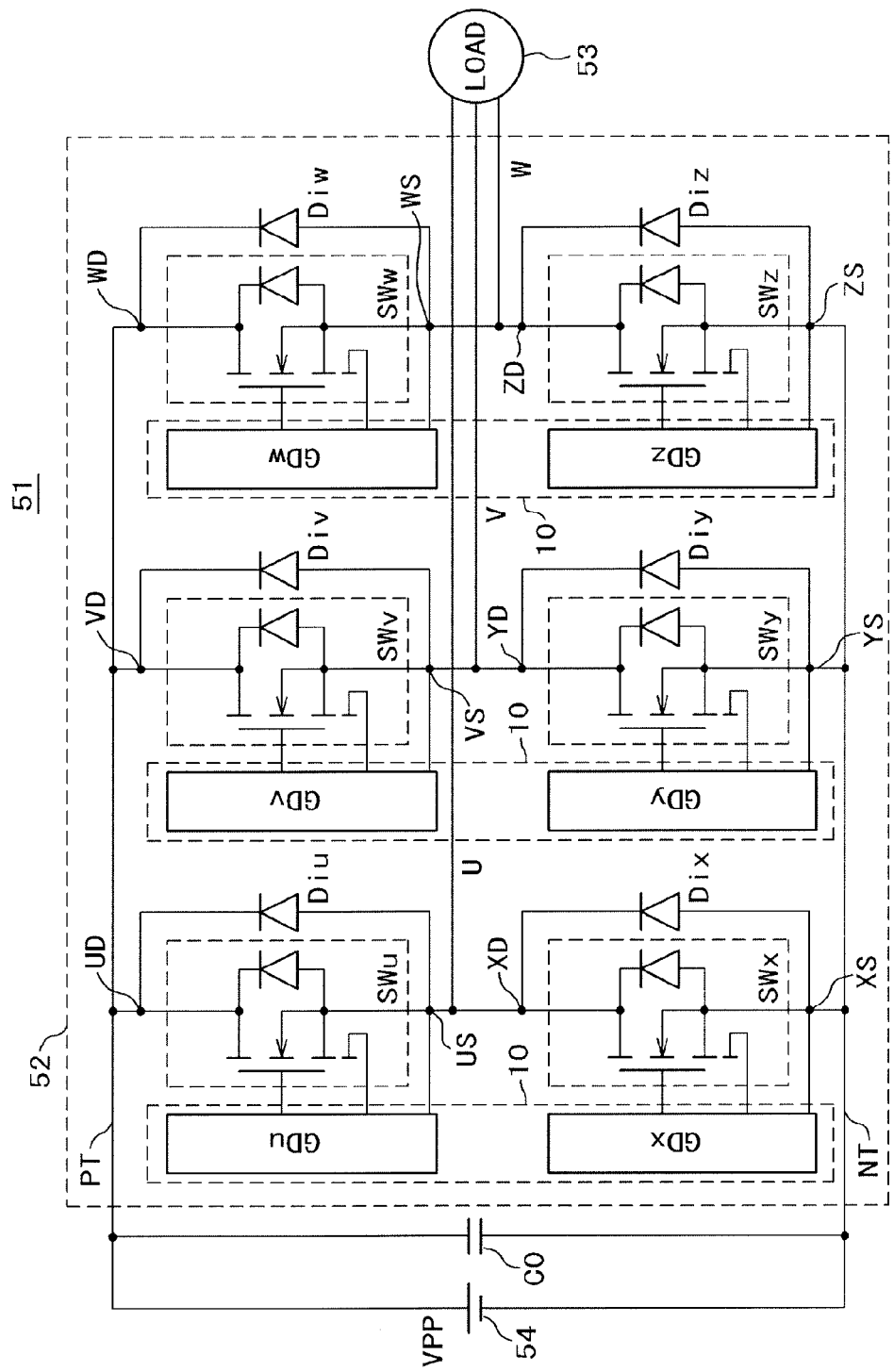
FIG. 5 is a diagram schematically illustrating a configuration of a power conversion device according to a second example.

Further, the high voltage input level of the described high-voltage level shift circuit is set to VB, and it is a matter of course that the high voltage input level may be the voltage VPP of a high-potential power source 54 of the switch element (see FIG. 5).

(f) Delay Circuit

Figure 3:
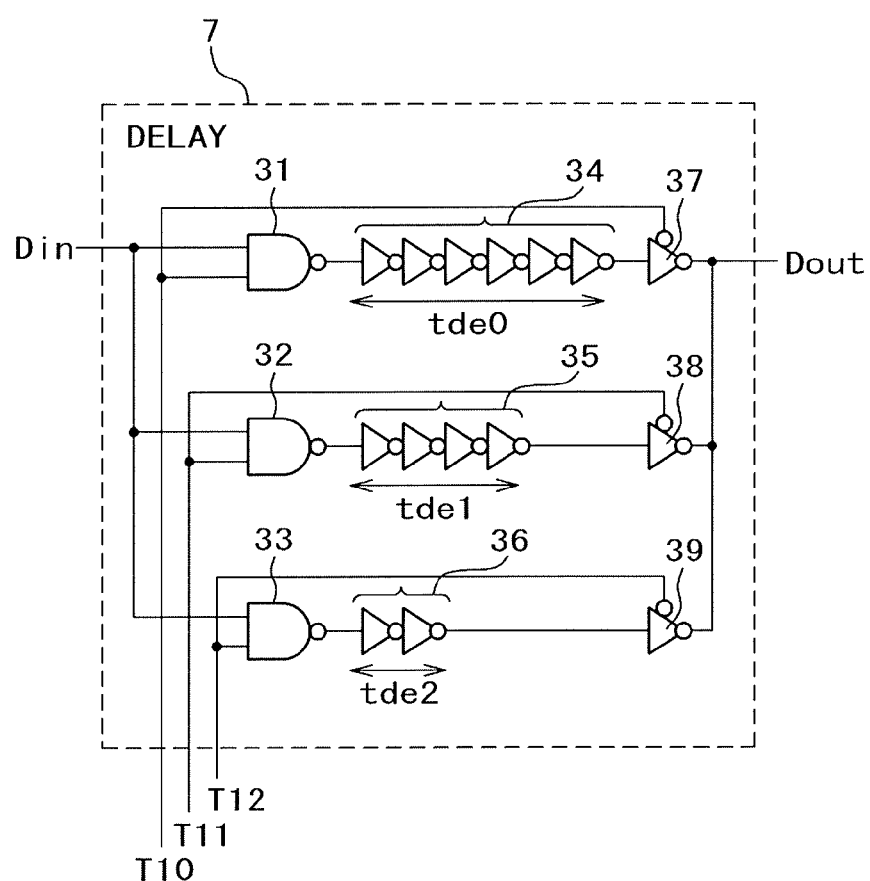
FIG. 3 is a diagram illustrating a delay circuit according to the first example.
Figure 4:
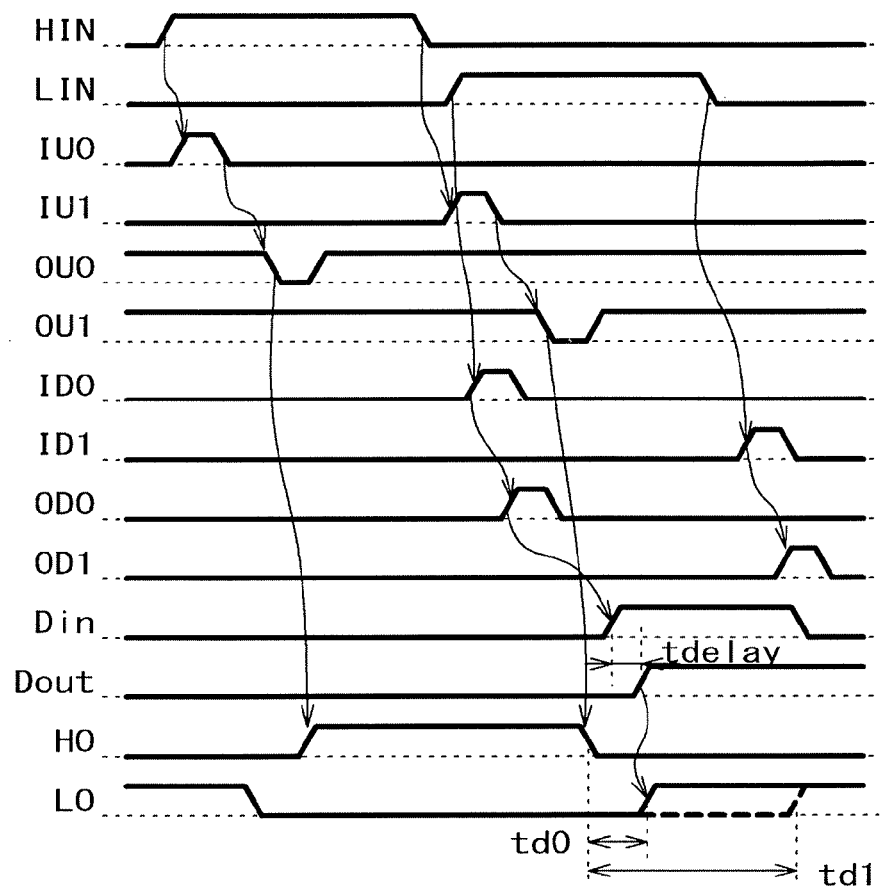
FIG. 4 is a diagram illustrating operation timing of the semiconductor device according to the first example.

FIG. 3 illustrates a circuit configuration of the delay circuit of FIG. 1. FIG. 4 illustrates a timing chart of a gate control circuit and a gate drive circuit. The delay circuit 7 is configured by connecting so-called CMOS inverting circuits in multistage, and can generate desired delay times (tde0, tde1, tde2). In addition, a plurality of delay times can be appropriately selected by selectively setting delay time select signals (TI0, TI1, TI2) to the high level. Specifically, the delay circuit 7 includes a delay generation circuit 34 in which inverting circuits are connected in six stages, a delay generation circuit 35 in which the inverting circuits are connected in four stages, and a delay generation circuit 36 in which the inverting circuits are connected in two stages. When the delay time select signal (TI0) is at the high level, an inverted logical AND (NAND) circuit 31 and a three-state buffer 37 are selected, and the signal (Din) is delayed by the delay time (tde0) through the delay unit 34 and output as the signal (Dout). When the delay time select signal (TI1) is at the high level, an inverted logical AND (NAND) circuit 32 and a three-state buffer 38 are selected, and the signal (Din) is delayed by the delay time (tde1) through the delay unit 35 and output as the signal (Dout). When the delay time select signal (TI2) is at the high level, an inverted logical AND (NAND) circuit 33 and a three-state buffer 39 are selected, and the signal (Din) is delayed by the delay time (tde2) through the delay generation circuit 36 and output as the signal (Dout). Further, the number of inverting circuits of the delay generation circuit is not limited to those of six stages, four stages, and two stages, and may be changed according to a desired delay time. In addition, the number of delay generation circuits is not limited to three, and may be larger than three at least. When the delay circuit of FIG. 3 is combined to the high-voltage level shift circuits 4H and 4L of FIG. 2 to form the configuration as illustrated in FIG. 1, the designed dead time (tde0) can be finely adjusted. In other words, it is possible to prevent that the switch elements on the high side and the low side are simultaneously turned on, so that the dead time can be minimized. Further, while the configuration of the delay generation circuit has been illustrated with a simple inverting circuit in FIG. 3, the delay generation circuit for adjusting a rising edge time of the gate drive signal and the delay generation circuit for adjusting the falling edge time may be created by appropriately using an inverted logical OR circuit (NOR) and an inverted logical AND circuit (NAND), and the desired delay time may be freely designed by using the same select signal as the delay time select signals (TI0, TI1, TI2).

(g) Circuit Operation

An example of operation waveforms of the circuit described above is illustrated in FIG. 4. The one-shot pulse generation circuit 3 detects the rising edge and the falling edge of the high-side input signal (HIN), and outputs the pulse signals of the input signal (IU0) and the input signal (IU1). Similarly, the rising edge and the falling edge of the low-side input signal (LIN) are detected, and the pulse signals of the input signal (ID0) and the input signal (ID1) are output.

Each of the input signals (IU0, IU1) is converted into the output signals (OU0, OU1) of an appropriate potential through the high-side high-voltage level shift circuit 4H. Herein, the output signals (OU0, OU1) are obtained by inverting the input signals (IU0, IU1) from the high level to the low level or vice versa. Thereafter, the output signals (OU0, OU1) drives the gate drive circuit 12H of the upper arm through the high-side pulse filter 5H and the high-side RS latch circuit 6H so as to output the upper-arm switch control signal (HO).

Each of the input signals (ID0, ID1) are converted into the output signals (OD0, OD1) of an appropriate potential through the low-side high-voltage level shift circuit 4L. Thereafter, the output signals (OD0, OD1) become the input signal (Din) through the low-side pulse filter 5L and the low-side RS latch circuit 6L. The delay circuit 7 outputs the signal (Dout) delayed by a delay time (tdelay), and drives the gate drive circuit 12L of the lower arm so as to output the lower-arm switch control signal (LO).

In the related art, the ON/OFF timing of the upper-arm switch control signal (HO) and the lower-arm switch control signal (LO) cannot be minimized as denoted by td1 in the drawing, thereby causing an excessive margin. However, with the technology of this example, the delay time (tdelay) is finely adjusted by the delay circuit 7, and can be minimized as denoted by a final dead time (td0) in an appropriate manner.

In addition, a delay generation period from the input signal (Din) of the delay circuit 7 to the output signal (Dout) may be set to avoid timing at which the upper-arm switch control signal (HO) is shifted from the high level to the low level or is shifted from the low level to the high level. When the control signal (HO) for the upper arm is shifted, the switch element (main switch) connected to the high-voltage-side power source level (VB) and the high-voltage-side source level (VS) is turned on or off. As a result, there is a possibility that noises may be flown into the power source level of the operation of delay circuit 7 and cause the potential to be fluctuated. Therefore, there is a concern that the delay circuit 7 may be not operated at a desired delay time. For this reason, as illustrated in FIG. 1, the delay circuit 7 may be disposed at the following stage of the low-side high-voltage level shift circuit 4L and at the previous stage of the gate drive circuit 12L of the lower arm. The delay circuit 7 is desirably disposed at a position as near as possible to the gate drive circuit 12L of the lower arm. The power source potential of the operation of the delay circuit 7 is stabilized by disposing the delay circuit 7 between the low-side high-voltage level shift circuit 4L and the gate drive circuit 12L of the lower arm. In other words, the desired delay time can be generated while avoiding the timing at which the upper-arm switch control signal (HO) is shifted. That is, the dead time can be appropriately minimized.

Second Example

FIG. 5 is a diagram schematically illustrating a configuration of a power conversion device according to a second example. A power conversion device 51 includes a three-phase inverter device 52 using the semiconductor device 10 (the gate drive circuits 12H and 12L and the gate drive control circuit 11) of the first example, a load circuit (LOAD) 53 such as a motor, a power source 54, and a capacitor C0. In FIG. 5, each of switch elements SWu, SWv, SWw, SWx, SWy, and SWz is an n-channel SiC-MOSFET, and a built-in diode (a body diode) is formed between the source and the drain. The built-in diode is operated as a freewheel diode. In addition, each of the switch elements SWu, SWv, SWw, SWx, SWy, and SWz includes a sense terminal for monitoring the current flowing to the SiC-MOSFET. Freewheel diodes Diu, Div, Diw, Dix, Diy, and Diz are connected between the sources and the drains of the switch elements SWu, SWv, SWw, SWx, SWy, and SWz, respectively. The switch elements SWu, SWv, and SWw are disposed in the upper arm, and the switch elements SWx, SWy, and SWz are disposed in the lower arm. The switch elements SWu and SWx are used for the U phase, the switch elements SWv and SWy are used for the V phase, and the switch elements SWw and SWz are used for the W phase.

Gate drive circuits GDu and GDx control and drive the switch elements SWu and SWx respectively in the semiconductor device 10 as illustrated in FIG. 1. Gate drive circuits GDv and GDy control and drive the switch elements SWv and SWy respectively in the semiconductor device 10. Gate drive circuits GDw and GDz control and drive the switch elements SWw and SWz respectively in the semiconductor device 10. Further, while not illustrated in the drawing, the circuit in common between the upper arm and the lower arm in the gate drive control circuit 11 as illustrated in FIG. 1 is added to each semiconductor device 10. The DC power source 54 and the capacitor C0 are connected between one end (drain node) PT of the switch element of the upper arm and one end (source node) NT of the switch element of the lower arm. The voltage (VPP) is applied between the drain node PT and the source node NT. Each gate drive circuit appropriately drives and turns on and off the corresponding switch element, so that three-phase (U phase, V phase, W phase) AC signals different in phase are generated from the voltage VPP of a DC signal. The load circuit 53 is appropriately controlled by the three-phase (U phase, V phase, W phase) AC signals.

Herein, the detailed operations of the hard switching of each of the U phase, the V phase, and the W phase are the same as the first example (FIG. 4 and the like). In the three-phase inverter device 52, the switch element SWu of the upper arm is shifted to the ON state in a state where the switch element SWx of the lower arm is in the OFF state. At this time, the gate drive circuit and the gate control circuit which drive the switch elements SWu and SWx are affected by an operation temperature of the inverter, and thus the timing for turning on or off the switch element may be deviated. In this case, a through current may flow from the high potential of the three-phase inverter device 52 to the lower potential, and may cause loss to be increased due to heating or the like. However, the gate drive control circuit 11 and the gate drive circuits 12H and 12L according to the first example have less variation in the delay time of the level shift circuit serving as a principal circuit for generating the dead time. Therefore, the dead times of the upper and lower switch elements can be reliably secured. In other words, it is possible to realize a stable power conversion operation with high reliability. In particular, such a three-phase inverter device may be operated in a large power system in many cases, and the through current due to a reduced dead time margin and an increased loss caused by the through current may become significant. However, according to the method of this example, for example, since the appropriate dead time minimization can be realized in addition to a normal loss reduction effect obtained when the SiC-MOSFET is applied to the inverter device, so that a loss reduction of the inverter device can be effectively achieved.

Figure 6:
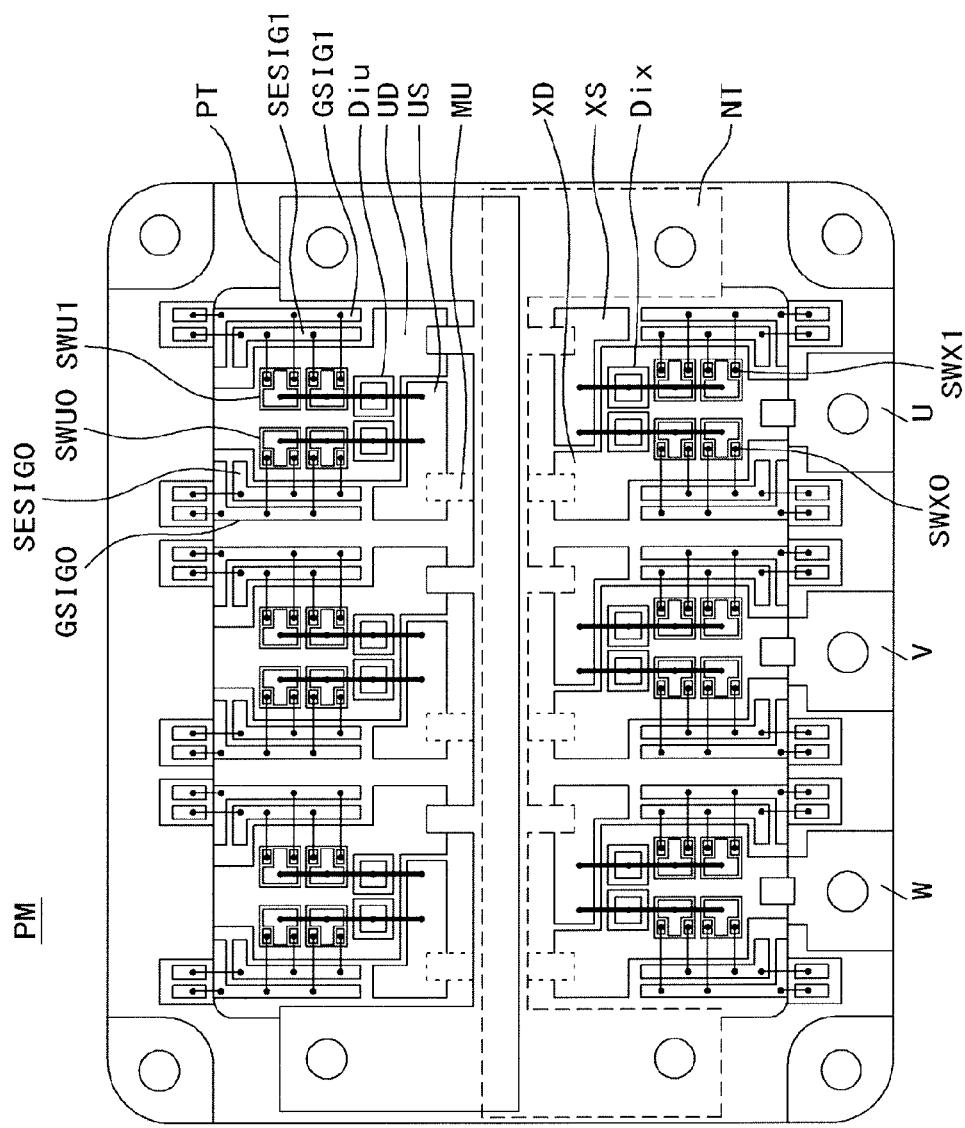
FIG. 6 is a plan view illustrating a power module in which switch elements and freewheel diodes of the power conversion device according to the second example are mounted.

FIG. 6 illustrates an example of a power module in which the switch elements and the freewheel diodes of the three-phase inverter device of FIG. 5 are mounted. A power module PM includes a positive connection terminal PT, a negative connection terminal NT, U-phase upper-arm switch groups SWU0 and SWU1, U-phase lower-arm switch groups SXW0 and SWX1, a U-phase upper-arm freewheel diode Diu, and a U-phase lower-arm freewheel diode Dix. The power module PM includes an upper-arm drain terminal UD to which the positive connection terminal PT, the drain pads of the U-phase upper-arm switch groups SWU0 and SWU1, and the cathode of the U-phase upper-arm freewheel diode Diu are connected. The power module PM includes an upper-arm source terminal US to which the source pads of the U-phase upper-arm switch groups SWU0 and SWU1 and the anode of the U-phase upper-arm freewheel diode Diu are connected. The power module PM includes a lower-arm drain terminal XD to which the drain pads of the U-phase lower-arm switch groups SXW0 and SWX1 and the cathode of the U-phase lower-arm freewheel diode Dix are connected. The power module PM includes a lower-arm source terminal XS to which the source pads of the U-phase lower-arm switch groups SXW0 and SWX1 and the anode of the U-phase lower-arm freewheel diode Dix are connected. The power module PM includes a connection terminal MU to which the upper-arm source terminal US and the lower-arm drain terminal XD are connected. The power module PM includes gate control terminals GSIG0 and GSIG1, sense control terminals SESIG0 and SESIG1, a U-phase output terminal U, a V-phase output terminal V, and a W-phase output terminal W. The gate control terminals GSIG0 and GSIG1 is connected to the gate pads of the U-phase upper-arm switch groups SWU0 and SWU1 and the U-phase lower-arm switch groups SXW0 and SWX1. The sense control terminals SESIG0 and SESIG1 is connected to the sense pads of the U-phase upper-arm switch groups SWU0 and SWU1. The U-phase output terminal U is connected to the lower-arm drain terminal XD. Further, the descriptions and the symbols of the respective elements and the terminals regarding the V phase and the W phase are similar to the structure of the U phase, and thus will be omitted for the sake of simplicity of the drawing.

In FIG. 6, four switch elements of the upper and lower arms are connected in parallel. In addition, four switch elements are divided into two parts. Therefore, two gate control terminals are for the U phase of the upper arm and two sense control terminals are for the U phase of the lower arm. Whether one control terminal is used for two switch elements or for one switch element may be appropriately selected according to a mounting type. For example, the configuration in the case of FIG. 6 is made in view of a point that the number of wirings from the drive circuit substrate is increased to cause a large system mount area when a number of control terminals are disposed in a typical power module PM, and a point that a wiring parasite impedance is suppressed to be relatively low by bisymmetrically disposing four switch elements by two elements each side and disposing the control terminals at each side. Of course, even in a case where eight switch elements are configured for the U phase of the upper arm, whether the switch elements are controlled by dividing into four or into eight may be optimally selected in view of its mounting type. According to this example, the drive timing of the plurality of switch elements can be appropriately adjusted, and the loss increase of the power conversion circuit can be suppressed while suppressing the area increase of the power module PM at a minimum. In addition, it is a matter of course that the effects described in the first and second examples can be achieved by using the gate drive circuit and the gate control circuit described in the first example.

Third Example

Figure 7:
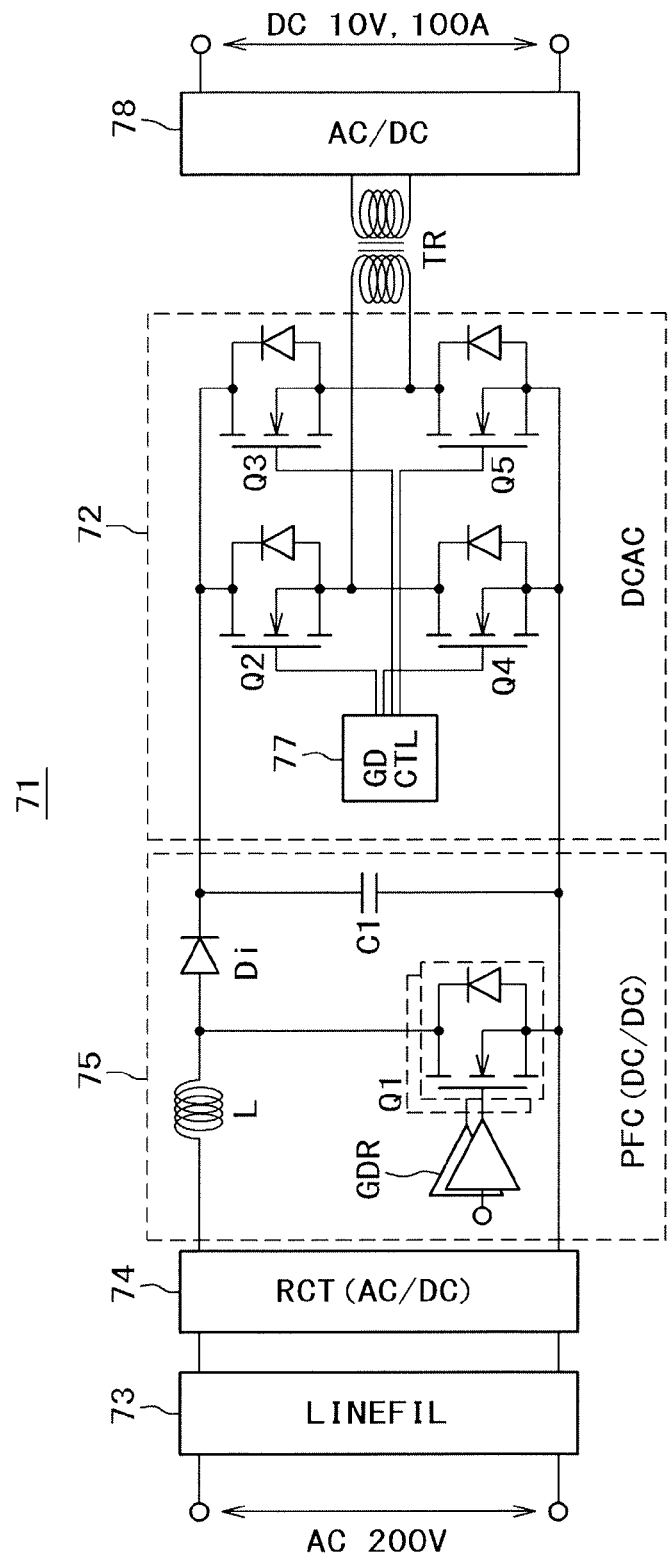
FIG. 7 is a diagram schematically illustrating a configuration of the power conversion device according to a third example.

FIG. 7 is a diagram schematically illustrating a configuration of a power conversion device according to a third example. An AC/DC power source device 71 serving as the power conversion device removes noises by a line filter (LINFIL) 73 from an AC input (for example, AC 200 V) and converts an AC voltage into a DC voltage (AC/DC) through a rectifier circuit (for example, a diode bridge and an output capacitor) (RCT) 74 in cooperation with an inverter device (DCAC) 72 using the gate drive circuit and the gate drive control circuit of the first example. Next, the DC level is boosted up to, for example, about 400 V by a voltage boosting circuit (PFC) 75. Herein, the voltage boosting circuit 75 is configured by a coil L, a chopper diode Di, main switch elements Q1 (two in parallel), a main switch drive circuit GDR, and a stabilization capacitor Cl. Further, the control method of the voltage boosting circuit 75 is generally known, and the description will be omitted.

Subsequently, the DC level of about 400 V from the voltage boosting circuit 75 is converted into the AC level by the inverter device 72, and then subjected to AC/AC conversion by a transformer TR (for example, AC 400 V→AC 10 V). Then, the AC signal obtained from the secondary coil of the transformer TR is converted into, for example, DC 10 V or DC 100 A by an AC/DC conversion circuit (ACDC) 76. Herein, the inverter device 72 is configured by, for example, a so-called full bridge circuit which is made of four switch elements Q2, Q3, Q4, and Q5 and a gate drive control circuit (GDCTL) 77. Further, while not particularly illustrated in the drawing, each of the switch elements Q2 to Q5 may be configured to be connected a plurality of chips in parallel. In such an exemplary configuration, it is possible to realize a low loss power source device by applying the method (the gate drive circuit 12 and the gate drive control circuit 11) of the first example to the gate drive control circuit 77 of the inverter device 72.

Fourth Example

Figure 8A:
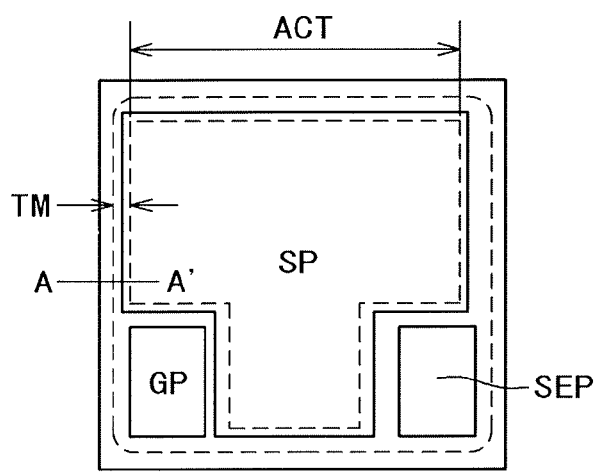
FIG. 8A is a plan view illustrating a schematic configuration of a SiC-MOSFET according to a fourth example.

FIGS. 8A and 8B are diagrams illustrating a schematic configuration of the SiC-MOSFET according to a fourth example. FIG. 8A is a plan view illustrating a schematic configuration of the SiC-MOSFET, and FIG. 8B is a cross-sectional view illustrating a schematic configuration taken along line A-A' of FIG. 8A. A SiC-MOSFET 81 is configured by the switch element used in the power conversion device of the second and third examples. As illustrated in FIG. 8A, the end sides (edges) of a source pad SP are positioned on the outside of an active element region ACT, and the end sides (edges) of a termination region TM are positioned on the outside of the source pad SP. In other words, the end sides (edges) of a sense pad SEP are positioned between the inside of the termination region TM and the outside of the active element region ACT. A gate pad GP and the source pad SP are positioned between the outside of the source pad SP and the inside of the termination region TM. In FIG. 8A, since the gate pad GP can be freely disposed at any position, the length of wire bonding can be shortened in a case where this configuration is applied to the mounting type illustrated in FIG. 10A below.

In addition, as illustrated in FIG. 8B, the SiC-MOSFET 81 includes a SiC substrate SUB, a drift layer DFT formed on the SiC substrate SUB, a p-type base layer 83 formed in the drift layer DFT, an n$^+$-type source layer 84 formed in the p-type base layer 83, and the termination region TM formed in the drift layer DFT. The SiC-MOSFET 81 includes a gate insulating film Tox which is formed on the drift layer DFT, the p-type base layer 83, and the n$^+$-type source layer 84, a gate electrode GPm formed on the gate insulating film Tox, and an interlayer insulating film Lay1 formed on the gate electrode GPm and the like. The SiC-MOSFET 81 includes the source pad SP formed on the interlayer insulating film Lay1, a silicon oxide film (SiO$_2$) 82 which is formed on the interlayer insulating film Lay1 and the source pad SP, and a drain electrode DRm formed on the rear surface side of the SiC substrate SUB. In the active element region ACT, a plurality of element transistors made of SiCMOS are formed, and connected in parallel to form one switch element. In other words, the plurality of source layers 84 are commonly connected to the source pad SP in a region (not illustrated), and the plurality of gate electrodes GPm are also commonly connected to the gate pad GP of FIG. 8A in a region (not illustrated). In FIG. 8B, by disposing the termination region TM in the peripheral of the active element region ACT, the active element region ACT can be sufficiently secured in the chip, and the ON current can be increased. In other words, it is possible to reduce an ON resistance.

<Modification>

Figure 9A:
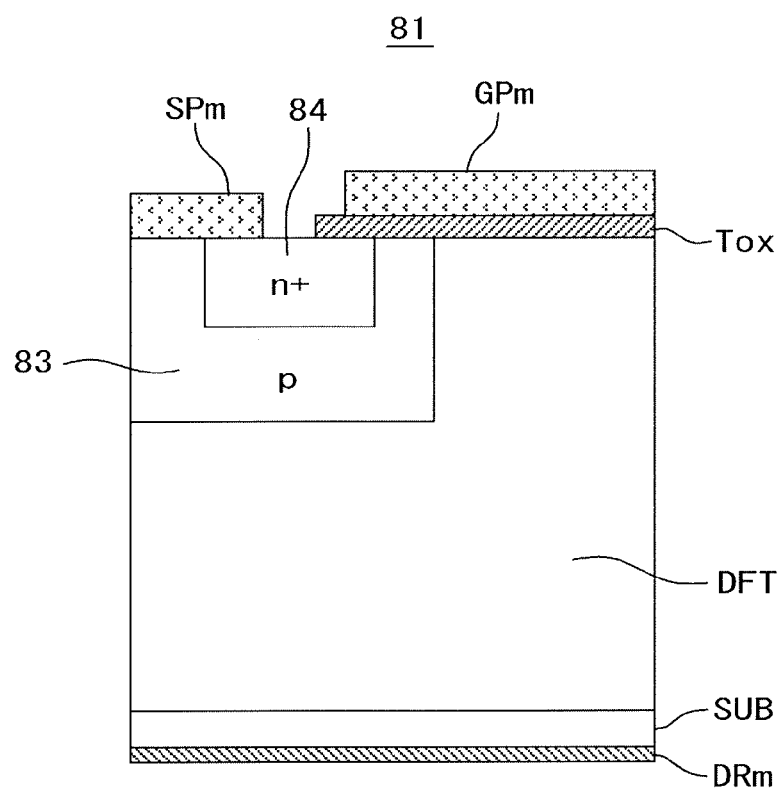
FIG. 9A is a cross-sectional view illustrating an exemplary configuration of each element transistor in an active element region in FIG. 8B.
Figure 9B:
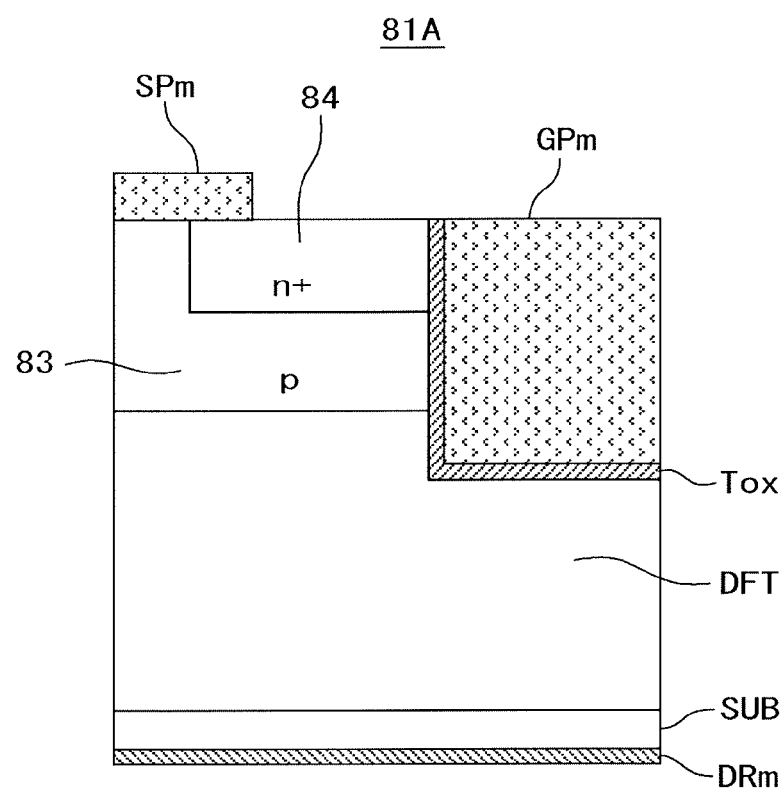
FIG. 9B is a cross-sectional view illustrating an exemplary configuration of a modification of FIG. 9A.

FIGS. 9A and 9B are diagram illustrating a cross-sectional structure of the SiC-MOSFET. FIG. 9A is a cross-sectional view illustrating an exemplary configuration of each element transistor in the active element region in FIG. 8B, and FIG. 9B is a cross-sectional view illustrating a modification of FIG. 9A. First, in FIG. 9B, one vertical-type SiC-MOSFET 81A of a trench structure is illustrated. The source layer 84 of the n$^+$-type region connected to a source electrode SPm is connected to the drift layer DFT through a channel formed in the base layer 83 of the p-type region. The drift layer DFT is, for example, an n$^-$type region, and serves to secure a breakdown voltage. The SiC substrate SUB is, for example, an n$^+$-type region, and the drain electrode DRm is connected to the SiC substrate SUB.

In such a trench structure, since there is no so-called JFET region (an n-type semiconductor region) interposed by the base layer 83, the ON resistance of the entire SiC-MOSFET is effectively reduced. In other words, it is possible to realize a power conversion system having a lesser loss by being combined with the semiconductor device (the gate drive circuit and the gate driver control circuit) according to the first example. The SiC-MOSFET 81A may be employed to configure the switch element used in the power conversion device according to the second and third examples.

On the other hand, FIG. 9A illustrates the SiC-MOSFET 81 of a so-called DMOS (Double Diffusion Metal Oxide Semiconductor) type in which the trench structure is not provided. In this case, the element has a simple structure, and the manufacturing cost can be effectively reduced compared to the SiC-MOSFET 81A of the trench structure type.

Figure 10A:
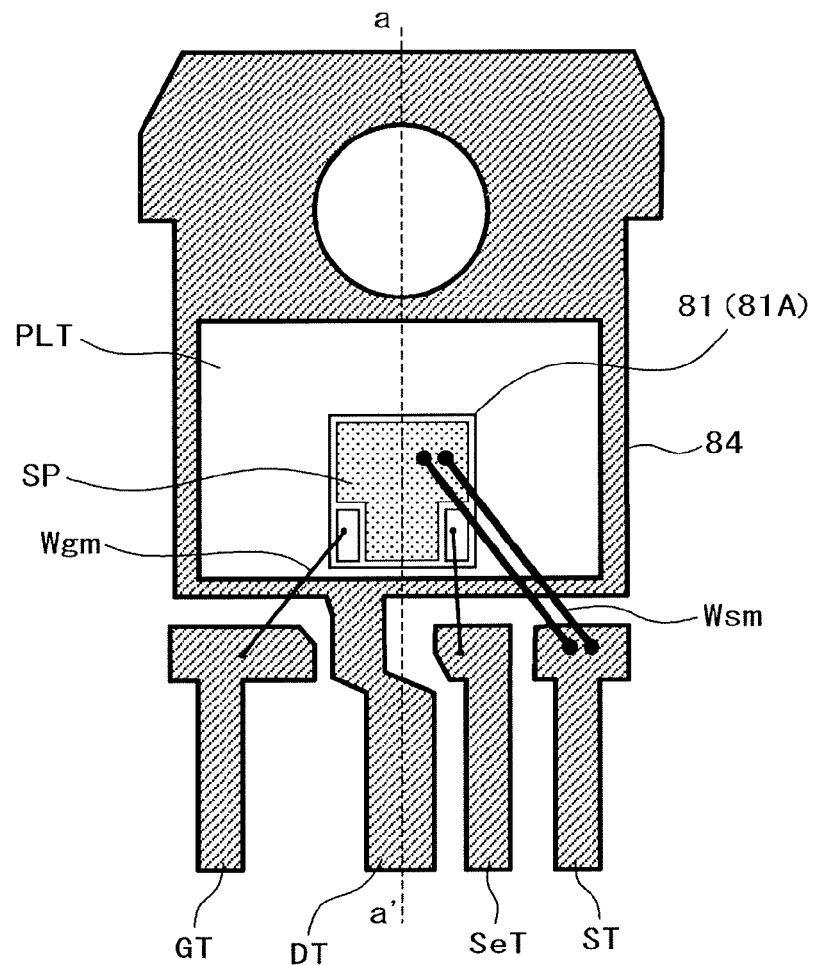
FIG. 10A is a plan view illustrating the SiC-MOSFET according to the fourth example which is mounted in a package.
Figure 10B:
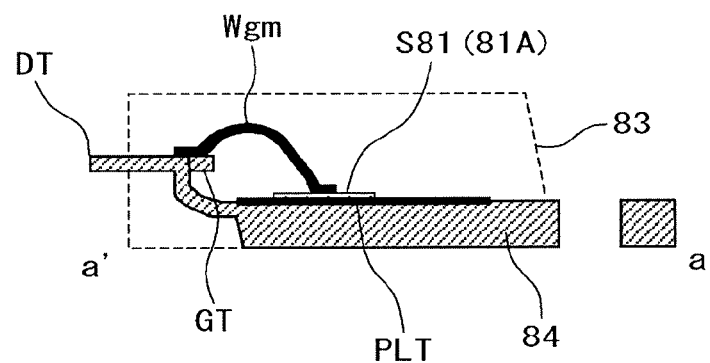
FIG. 10B is a cross-sectional view illustrating the SiC-MOSFET according to the fourth example which is mounted in the package.

FIGS. 10A and 10B are diagrams illustrating the SiC-MOSFET according to the fourth example which is mounted in a package. FIG. 10A is a plan view, and FIG. 10B is a cross-sectional view taken along line a-a' of FIG. 10A. In the example of FIGS. 10A and 10B, the SiC-MOSFET 81 (81A) is mounted on a metal plate PLT in the package. The drain electrode DRm of the SiC-MOSFET 81 (81A) is connected to a drain terminal DT through the metal plate PLT. The source pad SP is connected to a source terminal ST and the gate pad GP is connected to a gate terminal GT through bonding wires Wsm and Wgm, respectively. The SiC-MOSFET 81 (81A), the bonding wires Wsm and Wgm, and the like are sealed by a resin 83. Further, FIG. 10B is illustrated on an assumption that line a-a' is along with Wgm and DT for convenience sake.

With the arrangement and connection of the chip, the length of the bonding wire Wgm connected to the gate pad GP of the SiC-MOSFET 81 (81A) and the length of the bonding wire Wsm connected to the source pad SP can be shortened. In other words, it is possible to reduce a parasite inductance of the bonding wire and a parasite resistance (an ON resistance component) caused by the wire. For this reason, the noise generated at the time of switching can be suppressed at a low level, and thus the SiC-MOSFET 81 (81A) can be prevented from being biased by an excessive potential. Furthermore, since the chip in this example is disposed in a plan, the chip area of the SiC-MOSFET 81 (81A) can be freely designed. For this reason, both a low ON resistance and an ON current density can be easily designed so that various types of power semiconductor chips can be realized.

Hitherto, the invention made by the inventor has been specifically described based on the specific examples, but the invention is not limited to the examples. Various modifications can be made within a scope not departing from the spirit of the invention.

For example, in FIG. 5, the description has been made about an example in which the switch element and the freewheel diode are used as one logical switch to form the inverter device. However, the invention may be configured only by the SiC-MOSFET without using the external diode (for example, a SiC Schottky diode) for the freewheeling. In this case, a freewheeling current flows through the built-in diode of the SiC-MOSFET in normal time. However, since the dead time can be minimized when the gate drive circuit and the gate control circuit of the first example are used, a total time of the freewheeling current flowing to the built-in diode can be shortened. Since the time of the freewheeling current flowing to the built-in diode of the SiC-MOSFET can be shortened, a long-term reliability of the SiC-MOSFET can be improved, the lifespan of the switch element of the SiC-MOSFET can be lengthened, and a high reliability of the power conversion device can be realized.

In addition, each switch element is not limited to silicon (Si) and silicon carbide (SiC), and a compound device such as gallium nitride (GaN) may be used. In a case where a compound material is used for the switch element such as the inverter device, it is a matter of course that the loss in the inverter device can be reduced by combining the semiconductor device of the first example. In addition, it is a matter of course that the power conversion device using the semiconductor device of the first example can be applied to various power systems so as to achieve various effects. Representatively, an inverter device of an air conditioner, a DC/DC converter of a server power source, a power conditioner of a solar power system, and an inverter device of a hybrid vehicle/electric vehicle are exemplified.

REFERENCE SIGNS LIST

1H High-side Schmitt trigger circuit
1L Low-side Schmitt trigger circuit
2H High-side level shift circuit
2L Low-side level shift circuit
3 One-shot pulse generation circuit
4H High-side high-voltage level shift circuit
4L Low-side high-voltage level shift circuit
5H High-side pulse filter
5L Low-side pulse filter
6H High-side RS latch circuit
6L Low-side RS latch circuit
7 Delay circuit
8H High-side voltage detect protection circuit
8L Low-side voltage detect protection circuit
9 Logical product circuit
10 Semiconductor device
11 Gate drive control circuit
12H Upper-arm gate drive circuit
12L Lower-arm gate drive circuit
101 Power conversion device
104H First level shift circuit
104L Second level shift circuit
107 Delay circuit
110 Semiconductor device
112H First drive circuit
112L Second drive circuit
SW1 First switch element
SW2 Second switch element

The invention claimed is:

1. A semiconductor device used in a power conversion device that includes a first switch element of which a drain is connected to a first power source voltage and a second switch element of which a source is connected to a second power source voltage, a source of the first switch element and a drain of the second switch element being electrically connected, comprising:
a first drive circuit that drives the first switch element;
a second drive circuit that drives the second switch element;
a first level shift circuit; and
a second level shift circuit,
wherein the first drive circuit is connected to a third power source voltage which is higher by a predetermined potential with respect to a source potential of the first switch element, and is also connected to the source potential, wherein the second drive circuit is connected to a fourth power source voltage which is higher by a predetermined potential with respect to the second power source voltage, and is also connected to the second power source voltage, wherein the first level shift circuit is configured to convert an input voltage and to output a voltage level different from said input voltage to the first drive circuit, wherein the second level shift circuit converts an input signal and outputs a voltage level different from said input signal to the second drive circuit, and wherein power source voltages input to the first level shift circuit and the second level shift circuit are the third power source voltage and the second power source voltage.

2. The semiconductor device according to claim 1, further comprising: a delay circuit that is used to adjust a dead time.

3. The semiconductor device according to claim 2, wherein the delay circuit is disposed between the second level shift circuit and the second drive circuit.

4. The semiconductor device according to claim 2, wherein the delay circuit includes a circuit that generates a plurality of delay times, and is configured to select the plurality of delay times using an external input signal.

5. A power conversion device comprising: a first switch element of which a drain is connected to a first power source voltage; a second switch element of which a source is connected to a second power source voltage; and a semiconductor device, wherein a source of the first switch element and a drain of the second switch element are electrically connected, wherein the semiconductor device includes a first drive circuit that drives the first switch element, a second drive circuit that drives the second switch element, a first level shift circuit, a second level shift circuit, and a delay circuit that adjusts a dead time, wherein the first drive circuit is connected to a third power source voltage which is higher by a predetermined potential with respect to a source potential of the first switch element, and is also connected with the source potential, wherein the second drive circuit is connected to a fourth power source voltage which is higher by a predetermined potential with respect to the second power source voltage, wherein the first level shift circuit is configured to convert an input voltage and to output a voltage level different from said input voltage to the first drive circuit, wherein the second level shift circuit converts an input signal and outputs a voltage level different from said input signal to the second drive circuit, and wherein power source potentials input to the first level shift circuit and the second level shift circuit are the third power source voltage and the second power source voltage.

6. The power conversion device according to claim 5, wherein the delay circuit is disposed between the second level shift circuit and the second drive circuit.

7. The power conversion device according to claim 5, wherein the delay circuit includes a circuit that generates a plurality of delay times, and is configured to select the plurality of delay times using an external input signal.

8. The power conversion device according to claim 5, further comprising: a first freewheel diode and a second freewheel diode that are respectively connected to the first switch element and the second switch element in parallel, wherein the first and second freewheel diodes, the first switch element, and the second switch element are configured by one power module.

9. The power conversion device according to claim 5, wherein the first switch element and the second switch element are made of silicon, silicon carbide, or gallium nitride.

10. The power conversion device according to claim 9, wherein the first switch element and the second switch element are MOSFETs that are made of the silicon carbide, and wherein the power conversion device is an inverter device that uses built-in diodes of the first switch element and the second switch element as freewheel diodes.

11. A power conversion device comprising: a first switch element of which a drain is connected to a first power source voltage; a second switch element of which a source is connected to a second power source voltage;
a first drive circuit that drives the first switch element;
a second drive circuit that drives the second switch element;
a first level shift circuit;
a second level shift circuit; and
a delay circuit that is used to adjust a dead time,
wherein a source of the first switch element and a drain of the second switch element are electrically connected, wherein the first drive circuit is operated using a third power source voltage which is higher by a predetermined potential with respect to a source potential of the first switch element, and is also operated using the source potential, wherein the second drive circuit is operated using a fourth power source voltage which is higher by a predetermined potential with respect to the second power source voltage, wherein the first level shift circuit is configured to convert an input voltage and to output a voltage level different from said input voltage to the first drive circuit, wherein the second level shift circuit is configured to convert an input voltage and to output a voltage level different from said input voltage to the second drive circuit, wherein power source potentials input to the first level shift circuit and the second level shift circuit are the third power source voltage and the second power source voltage, and wherein when a control signal is input to the first level shift circuit and the second level shift circuit, operation voltages of the first drive circuit and the second drive circuit are generated using the second power source voltage and the third power source voltage.

12. The power conversion device according to claim 11, wherein the delay circuit is disposed between the second level shift circuit and the second drive circuit.

13. The power conversion device according to claim 11, wherein the delay circuit includes a unit that generates a plurality of delay times, and is configured to select the plurality of delay times using an external input signal.

14. The power conversion device according to claim 11, further comprising: a first freewheel diode that is connected to the first switch element in parallel; and a second freewheel diode that is connected to the second switch element in parallel.

15. The power conversion device according to claim 11, wherein the first switch element and the second switch element are MOSFETs that are made of silicon carbide, and wherein the power conversion device is an inverter device that uses built-in diodes of the first switch element and the second switch element as freewheel diodes.

* * * * *